United States Patent
Nagaya et al.

(10) Patent No.: US 11,881,407 B2
(45) Date of Patent: Jan. 23, 2024

(54) PROCESSED WAFER AND METHOD OF MANUFACTURING CHIP FORMATION WAFER

(71) Applicants: DENSO CORPORATION, Kariya (JP); TOYOTA JIDOSHA KABUSHIKI KAISHA, Toyota (JP); MIRISE Technologies Corporation, Nisshin (JP); DISCO Corporation, Tokyo (JP)

(72) Inventors: Masatake Nagaya, Nisshin (JP); Teruaki Kumazawa, Nisshin (JP); Yuji Nagumo, Nisshin (JP); Kazuya Hirata, Tokyo (JP); Asahi Nomoto, Tokyo (JP)

(73) Assignees: DENSO CORPORATION, Kariya (JP); TOYOTA JIDOSHA KABUSHIKI KAISHA, Toyota (JP); MIRISE Technologies Corporation, Nisshin (JP); DISCO Corporation, Tokyo (JP)

(*) Notice: Subject to any disclaimer, the term of this patent is extended or adjusted under 35 U.S.C. 154(b) by 166 days.

(21) Appl. No.: 17/463,243

(22) Filed: Aug. 31, 2021

(65) Prior Publication Data
US 2022/0130675 A1    Apr. 28, 2022

(30) Foreign Application Priority Data
Oct. 28, 2020    (JP) .................................. 2020-180823

(51) Int. Cl.
*H01L 21/78*    (2006.01)
*H01L 21/268*    (2006.01)
*H01L 21/02*    (2006.01)

(52) U.S. Cl.
CPC .... *H01L 21/2683* (2013.01); *H01L 21/02447* (2013.01); *H01L 21/7813* (2013.01)

(58) Field of Classification Search
CPC ........... H01L 21/2683; H01L 21/02447; H01L 21/7813; H01L 21/7806; H01L 21/6835;
(Continued)

(56) References Cited

U.S. PATENT DOCUMENTS

2014/0038392 A1*  2/2014  Yonehara ............ H01L 33/0093
                                                                    438/463
2015/0380291 A1   12/2015  Nakajima
(Continued)

FOREIGN PATENT DOCUMENTS

JP    2013-131588 A    7/2013
JP    2019-046859 A    3/2019
JP    2019046859 A  *  3/2019

*Primary Examiner* — Fazli Erdem
(74) *Attorney, Agent, or Firm* — POSZ LAW GROUP, PLC

(57) ABSTRACT

A method of manufacturing a chip formation wafer includes: forming an epitaxial film on a first main surface of a silicon carbide wafer to provide a processed wafer having one side adjacent to the epitaxial film and the other side; irradiating a laser beam into the processed wafer from the other side of the processed wafer so as to form an altered layer along a surface direction of the processed wafer; and separating the processed wafer with the altered layer as a boundary into a chip formation wafer having the one side of the processed wafer and a recycle wafer having the other side of the processed wafer. The processed wafer has a beveling portion at an outer edge portion of the processed wafer, and an area of the other side is larger than an area of the one side in the beveling portion.

5 Claims, 7 Drawing Sheets

(58) Field of Classification Search
CPC .......... H01L 2221/68386; H01L 21/78; H01L 21/68; H01L 21/268; H01L 21/26; H01L 21/02
USPC ........................................................ 438/458
See application file for complete search history.

(56) References Cited

U.S. PATENT DOCUMENTS

| | | |
|---|---|---|
| 2016/0158882 A1 | 6/2016 | Hirata et al. |
| 2019/0348272 A1 | 11/2019 | Ecker et al. |
| 2021/0175123 A1* | 6/2021 | Beyer ................ H01L 21/8213 |
| 2023/0078982 A1 | 3/2023 | Ecker et al. |

* cited by examiner

PROCESSED WAFER AND METHOD OF MANUFACTURING CHIP FORMATION WAFER

CROSS REFERENCE TO RELATED APPLICATION

This application is based on Japanese Patent Application No. 2020-180823 filed on Oct. 28, 2020, the disclosure of which is incorporated herein by reference in its entirety.

TECHNICAL FIELD

The present disclosure relates to a processed wafer made of silicon carbide (hereinafter, simply referred to as SiC) and a method of manufacturing a chip formation wafer using the processed wafer.

BACKGROUND

A SiC ingot having a first main surface and a second main surface is irradiated with a laser beam to separate the SiC ingot into a SiC wafer at an altered layer.

SUMMARY

According to a first aspect of the present disclosure, a method of manufacturing a chip formation wafer on which a semiconductor element is formed, the method comprising:
preparing a silicon carbide wafer made of silicon carbide and having a first main surface and a second main surface opposite to the first main surface;
forming an epitaxial film made of silicon carbide on the first main surface of the silicon carbide wafer to provide a processed wafer having one side adjacent to the epitaxial film and the other side;
irradiating a laser beam into the processed wafer from the other side of the processed wafer so as to form an altered layer along a surface direction of the processed wafer;
separating the processed wafer into a chip formation wafer having the one side of the processed wafer and a recycle wafer having the other side of the processed wafer at the altered layer as a boundary; and
reusing the recycle wafer as a silicon carbide wafer.
The processed wafer has a beveling portion at an outer edge portion of the processed wafer, and an area of the other side is larger than an area of the one side in the beveling portion.

DESCRIPTION OF EMBODIMENT

Figure 1A:
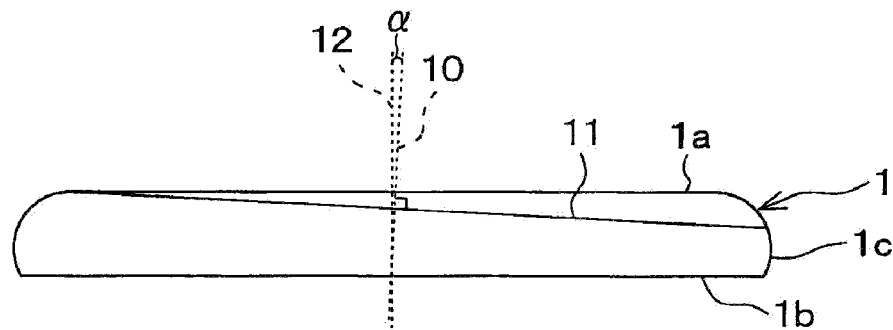
FIG. 1A is a cross-sectional view illustrating a manufacturing process of a semiconductor chip according to a first embodiment.

To begin with, examples of relevant techniques will be described.

A SiC ingot having a first main surface and a second main surface is irradiated with a laser beam to separate the SiC ingot into a SiC wafer. Specifically, in this method, a laser beam is irradiated to the second main surface in the normal direction of the second main surface of the SiC ingot to form an altered layer in the SiC ingot. The altered layer is used as a boundary to separate the SiC wafer from the SiC ingot. In this case, the second main surface is composed of a C plane.

A semiconductor chip is formed using a SiC wafer as described above, for example, as follows. First, an epitaxial film is formed on the SiC wafer to form a processed wafer, and a semiconductor element is formed on the processed wafer. After that, the processed wafer is thinned to a desired thickness to form a chip formation wafer, and the chip formation wafer is divided into chip units to form a semiconductor chip.

In this case, when the processed wafer is thinned to form a chip formation wafer, the processed wafer is irradiated with a laser beam to form an altered layer so as to separate the SiC wafer from the SiC ingot. A part of the processed wafer to be thinned is separated using the altered layer as a boundary.

When forming a semiconductor chip, it is conceivable to form a beveling portion on the outer edge portion of the processed wafer in order to facilitate the formation of semiconductor element or the handling of processed wafer. However, when irradiating a laser beam to the processed wafer to form an altered layer on the processed wafer having the beveling portion, the laser beam is scattered, since the laser beam and the beveling portion are not orthogonal to each other. In this case, the altered layer may not be formed properly inside the processed wafer. Therefore, it may be difficult to separate the chip formation wafer from the processed wafer having the beveling portion.

The present disclosure provides a processed wafer having a beveling portion, in which a chip formation wafer can be easily separated from the processed wafer, and a method for manufacturing the chip formation wafer.

According to a first aspect of the present disclosure, a method of manufacturing a chip formation wafer on which a semiconductor element is formed, the method comprising:

preparing a silicon carbide wafer made of silicon carbide and having a first main surface and a second main surface opposite to the first main surface;

forming an epitaxial film made of silicon carbide on the first main surface of the silicon carbide wafer to provide a processed wafer having one side adjacent to the epitaxial film and the other side;

irradiating a laser beam into the processed wafer from the other side of the processed wafer so as to form an altered layer along a surface direction of the processed wafer;

separating the processed wafer into a chip formation wafer having the one side of the processed wafer and a recycle wafer having the other side of the processed wafer at the altered layer as a boundary; and reusing the recycle wafer as a silicon carbide wafer.

The processed wafer has a beveling portion at an outer edge portion of the processed wafer, and an area of the other side is larger than an area of the one side in the beveling portion.

Accordingly, when the altered layer is formed inside the processed wafer by irradiating the processed wafer with a laser beam, it becomes easy to irradiate the laser beam to the immediate vicinity of the end of the processed wafer, compared with a case where the area of the other side of the processed wafer is equal to or less than the area of the one side. Therefore, the altered layer can be easily formed up to the end of the processed wafer, and the chip formation wafer can be easily separated from the processed wafer.

Further, a processed wafer made of SiC has a one side, the other side opposite to the one side, and a beveling portion formed at the outer edge portion of the processed wafer. The beveling portion is formed so that the other side has a larger area than the one side.

Accordingly, when the altered layer is formed inside the processed wafer by irradiating the processed wafer with a laser beam, it becomes easy to irradiate the laser beam to the immediate vicinity of the end of the processed wafer, compared with a case where the area of the other side of the processed wafer is equal to or less than the area of the one side. Therefore, the altered layer can be easily formed up to the end of the processed wafer, and the chip formation wafer can be easily separated from the processed wafer.

The reference numerals attached to the components and the like indicate an example of correspondence between the components and the like and specific components and the like in an embodiment to be described below.

Hereinafter, an embodiment will be described with reference to the drawings. In the embodiment, the same reference numerals are assigned to portions that are the same or equivalent to each other for description.

A method for manufacturing a semiconductor chip 100 according to an embodiment will be described with reference to the drawings.

First, as shown in FIG. 1A, a silicon carbide (SiC) wafer 1 having a first main surface 1a and a second main surface 1b is prepared. The SiC wafer 1 has a bulk wafer shape. The thickness of the SiC wafer 1 is arbitrary, but is, for example, about 325 to 525 μm.

Figure 1E:
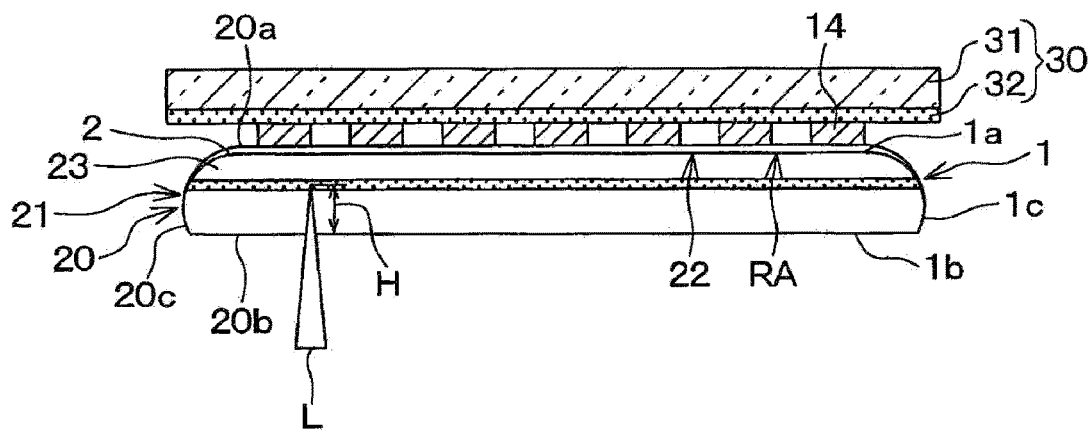
FIG. 1E is a cross-sectional view illustrating a manufacturing process of the semiconductor chip subsequent to FIG. 1D.
Figure 2:
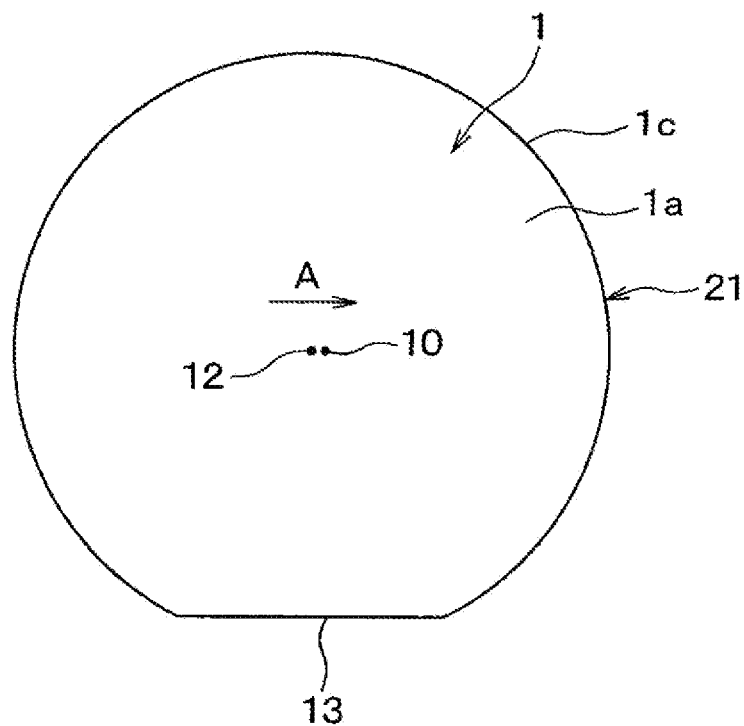
FIG. 2 is a plan view of a SiC wafer shown in FIG. 1A.

The SiC wafer 1 of the present embodiment is a 6-inch hexagonal single crystal wafer. As shown in FIGS. 1A and 2, the SiC wafer 1, is substantially disk-shaped as a whole. In the SiC wafer 1 of the present embodiment, the area of the second main surface 1b is larger than the area of the first main surface 1a. The side surface 1c connecting the first main surface 1a and the second main surface 1b is a curved surface. In the SiC wafer 1, a Si plane is the first main surface 1a, and a C plane is the second main surface 1b. In the process of FIG. 1E described later, the laser beam L is irradiated to the second main surface 1b. The second main surface 1b is a mirror surface formed by mirror processing such as polishing using a grinder or a chemical mechanical polishing (CMP).

The SiC wafer 1 has a c-axis (<0001> direction) 10 from the first main surface 1a to the second main surface 1b and a c-plane ({0001} plane) 11 orthogonal to the c-axis 10. In the present embodiment, the c-axis 10 is tilted with respect to a perpendicular line 12 perpendicular to the first main surface 1a, such that the c-plane 11 and the first main surface 1a have a predetermined off angle α. The off angle is, for example, about 4°. However, the off angle α is not limited to this, and is appropriately set according to a semiconductor element to be manufactured, and is appropriately set in a range of, for example, less than 10°.

As shown in FIG. 2, the SiC wafer 1 is formed with an orientation flat 13 indicating the crystal orientation. The orientation flat 13 of the present embodiment is formed parallel to an off direction A extended from the perpendicular line 12 to the c-axis 10.

The SiC wafer 1 is also prepared by reusing the recycle wafer 60 formed in the process of FIG. 1F, which will be described later. Therefore, if necessary, a protective film made of an oxide film or the like may be formed on the second main surface 1b of the SiC wafer 1.

Figure 1B:
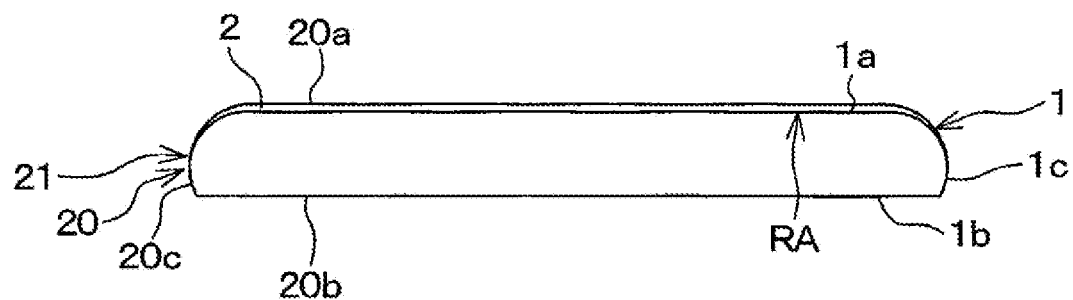
FIG. 1B is a cross-sectional view illustrating a manufacturing process of the semiconductor chip subsequent to FIG. 1A.

Next, as shown in FIG. 1B, the epitaxial film 2 is formed on the first main surface 1a of the SiC wafer 1, so as to prepare a processed wafer 20 having one side 20a, the other side 20b opposite to the one side 20a, and a side surface 20c connecting the one side 20a to the other side 20b. Then, a chip forming region RA is formed on the one side 20a of the processed wafer 20, to form a semiconductor element described later.

In this embodiment, the epitaxial film 2 is an n⁻ type epitaxial layer. The n⁻ type epitaxial layer is used to form a one-side element component 22 such as a diffusion layer, which will be described later, and has a thickness of, for example, about 10 μm. In the following, the surface of the processed wafer 20 adjacent to the epitaxial film 2 is referred to as one side 20a of the processed wafer 20. The surface of the processed wafer 20 made of the SiC wafer 1 is referred to as the other side 20b of the processed wafer 20. The surface of the processed wafer 20 connecting the one side 20a and the other side 20b with each other is referred to as the side surface 20c.

Figure 3:
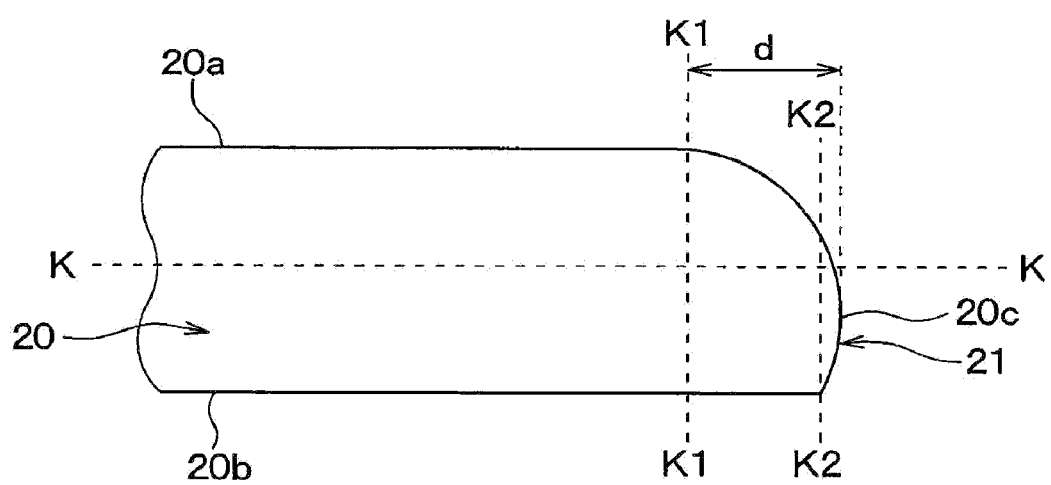
FIG. 3 is a schematic cross-sectional view illustrating a beveling portion of the processed wafer shown in FIG. 1C.

Further, the processed wafer 20 having the beveling portion 21 formed on the side surface 20c, which is an outer edge portion, is prepared. Specifically, as shown in FIG. 3, a horizontal virtual plane K is defined along the surface direction of the processed wafer 20 to pass through the center between the one side 20a and the other side 20b of the processed wafer 20 in the thickness direction. The beveling portion 21 is formed such that an upper portion adjacent to the one side 20a and a lower portion adjacent to the other side 20b are formed asymmetric with respect to the horizontal virtual plane K. More specifically, the beveling portion 21 is formed so that the area of the other side 20b of the processed wafer 20 is larger than the area of the one side 20a. For example, a first orthogonal virtual plane K1 is defined to be orthogonal to the horizontal virtual plane K and to pass through the boundary between the one side 20a and the beveling portion 21. A second orthogonal virtual plane K2 is defined to be orthogonal to the horizontal virtual plane K and to pass through the boundary between the other side 20b and the beveling portion 21. In this case, the beveling portion 21 is formed such that the second orthogonal virtual plane K2 is located between the outer edge of the processed wafer 20 and the first orthogonal virtual plane K1. In other words, the beveling portion 21 is formed so that the curvature of a first portion between the other side 20b and the horizontal virtual plane K is larger than the curvature of a second portion between the one side 20a and the horizontal virtual plane K. In the present embodiment, the beveling portion 21 is formed to have a length d from the intersection of the horizontal virtual plane K and the side surface 20c to the first orthogonal virtual plane K1, and the length d is 100 µm or more.

Such a processed wafer 20 is prepared as follows, for example, by preparing the SiC wafer 1 in which the first main surface 1a has a larger area than the second main surface 1b and the side surface 1c is curved. As a result, the processed wafer 20 is prepared, in which the area of the other side 20b is larger than the area of the one side 20a, using the shape of the SiC wafer 1 as the base. When the epitaxial film 2 is formed on the first main surface 1a of the SiC wafer 1, the shape of the epitaxial film 2 corresponds to the shape of the SiC wafer 1. Further, such a processed wafer 20 may be prepared, for example, by forming the beveling portion 21 by a shape adjustment processing such as etching appropriately after forming the epitaxial film 2 on the first main surface 1a of the SiC wafer 1.

Figure 1C:
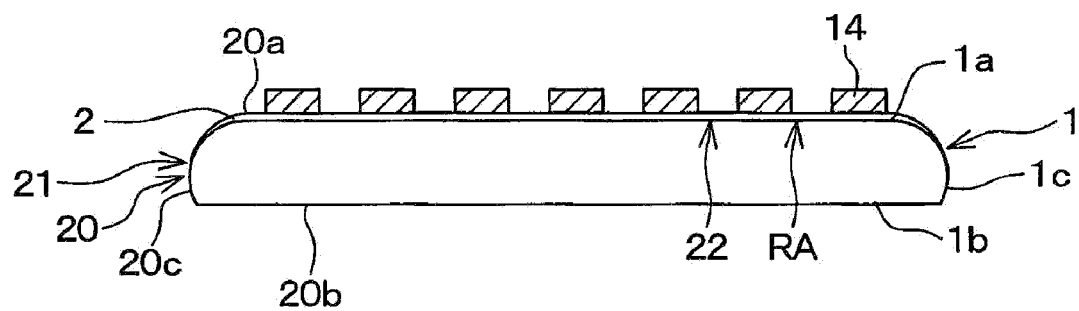
FIG. 1C is a cross-sectional view illustrating a manufacturing process of the semiconductor chip subsequent to FIG. 1B.

As shown in FIG. 1C, a general semiconductor manufacturing process is performed to form the one-side element component 22 of a semiconductor element, such as a gate electrode 14, a diffusion layer, a surface electrode, a wiring pattern, and a passivation film (not shown) in each chip forming region RA. As the semiconductor element, those having various configurations are adopted. For example, a power device or the like is adopted as the semiconductor element. After that, if necessary, a surface protection film made of a resist or the like is formed on the one side 20a of the processed wafer 20.

Figure 1D:
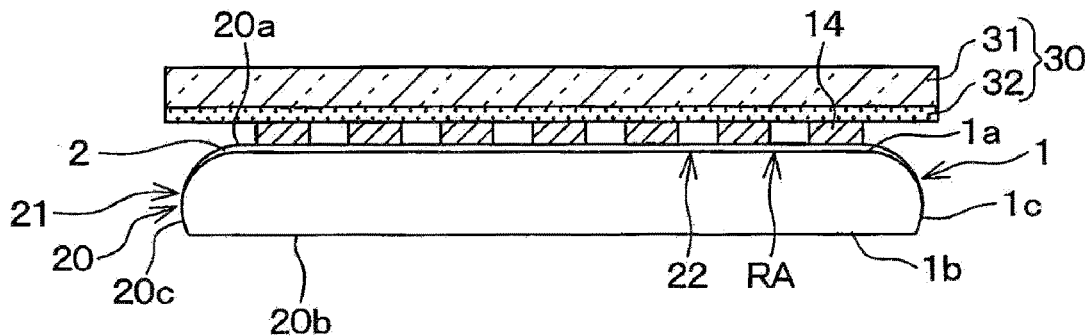
FIG. 1D is a cross-sectional view illustrating a manufacturing process of the semiconductor chip subsequent to FIG. 1C.

Subsequently, as shown in FIG. 1D, a holding member 30 is arranged on the one side 20a of the processed wafer 20. The holding member 30 is, for example, a dicing tape or the like having a base material 31 and an adhesive 32. The base material 31 is made of a material that does not easily warp during the manufacturing process. The base material 31 is made of, for example, glass, silicon substrate, ceramics, or the like. The adhesive 32 is made of a material whose adhesive strength can be changed, for example, depending on temperature or light. In this case, the adhesive 32 is made of, for example, an ultraviolet curable resin, wax, double-sided tape, or the like. The adhesive 32 may be made of a material that can maintain the adhesive force when forming the other-side element component 25 shown in FIG. 1G, which will be described later.

Next, as shown in FIG. 1E, the laser beam L is irradiated from the normal direction with respect to the other side 20b of the processed wafer 20, so as to form an altered layer 23 along the surface direction of the processed wafer 20 at a position having a predetermined depth H from the other side 20b of the processed wafer 20. In the present embodiment, the predetermined depth H for forming the altered layer 23 is set according to the ease of handling of the chip formation wafer 50 described later, the withstand voltage of the semiconductor chip 100 described later, and the like. The predetermined depth H is set to about 200 to 370 µm so that the thickness of the chip formation wafer 50 is about 100 µm. The depth means a length from the other side 20b to the one side 20a along the depth direction which is the normal direction of the other side 20b.

Hereinafter, the step of forming the altered layer 23 will be specifically described. When forming the altered layer 23, a laser light source, a mirror, a condensing lens and a laser device are prepared. The laser light source oscillates the laser beam L. The mirror is arranged so as to change the direction of the optical axis (that is, the optical path) of the laser beam L. The condensing lens (of a condensing optical system) condenses the laser beam L. The laser device has a displaceable stage. The processed wafer 20 is placed on the stage, and the position of the stage is adjusted such that the condensing point of the laser beam becomes the predetermined depth H by irradiating the laser beam L from the other side 20b of the processed wafer 20, while the condensing point of the laser beam L is relatively scanned along the surface direction of the processed wafer 20.

Figure 4:
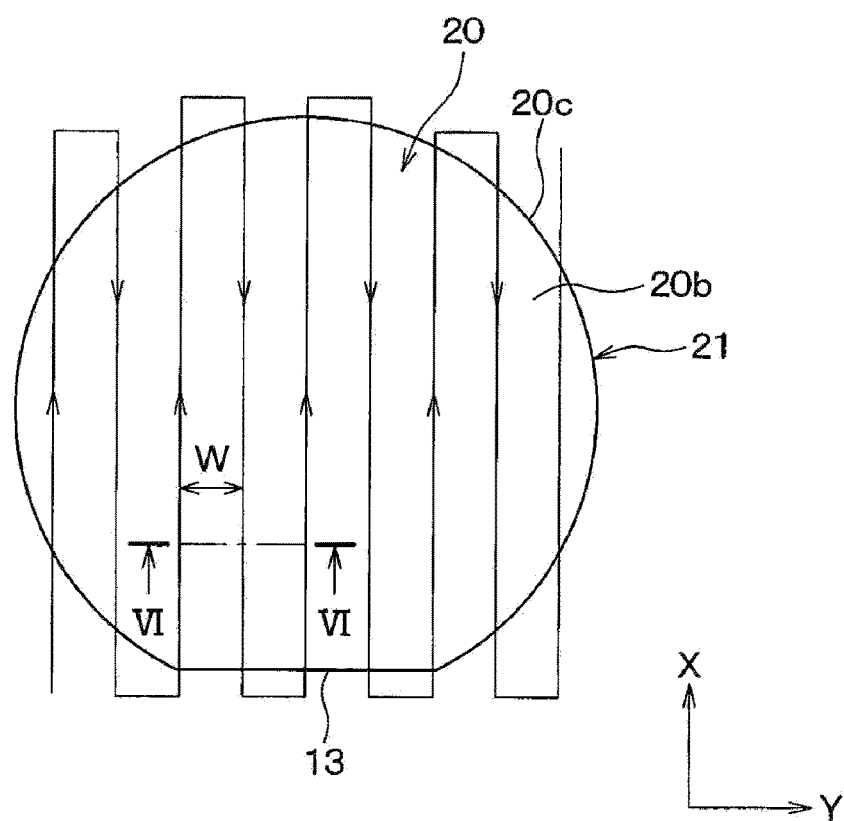
FIG. 4 is a schematic view illustrating a path of a laser beam when irradiating the processed wafer of FIG. 1E with the laser beam.
Figure 5:
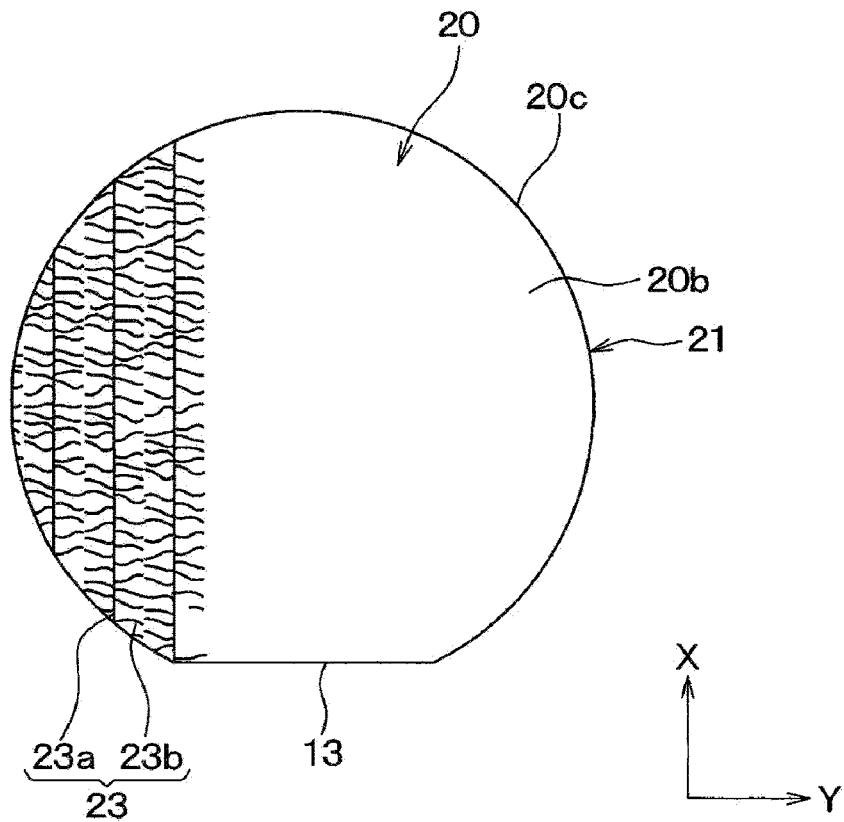
FIG. 5 is a schematic plan view illustrating an altered layer when the processed wafer of FIG. 1E is irradiated with a laser beam.
Figure 6:
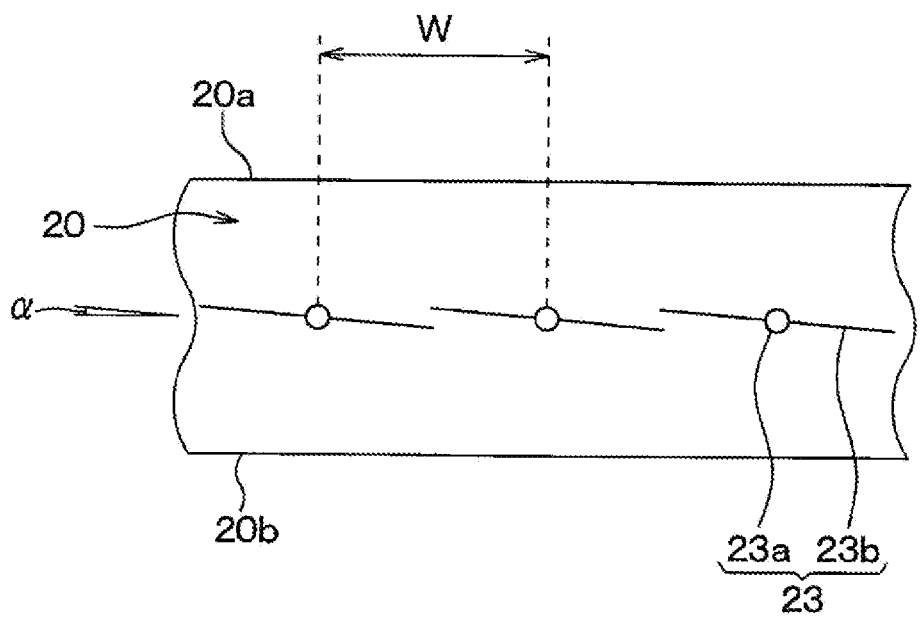
FIG. 6 is a schematic cross-sectional view illustrating an altered layer when the processed wafer of FIG. 1E is irradiated with a laser beam.

More specifically, when forming the altered layer 23, the following is performed. As shown in FIG. 4, the off direction A is set as Y direction, and the surface direction parallel to the one side 20a of the processed wafer 20 is set as X direction orthogonal to the Y direction. The laser beam L is scanned along the X direction. After that, the scanning of the laser beam is shifted in the Y direction, and is again scanned along the X direction. As a result, inside the processed wafer 20, as shown in FIGS. 5 and 6, SiC is separated into amorphous Si and amorphous C by irradiation with the laser beam L. The modified layer 23a is formed by absorbing the laser beam L efficiently into the separated amorphous C. Further, a crack 23b propagating from the modified layer 23a along the c-plane 11 is formed. As a result, the altered layer 23 having the modified layer 23a and the crack 23b is formed inside the processed wafer 20.

Note that FIG. 6 is a schematic cross-sectional view taken along the line VI-VI in FIG. 4. Further, the index amount W of the laser beam L shifted in the Y direction is set based on the width of the crack 23b formed by propagating in the c-plane direction. For example, in the present embodiment, when the crack 23b formed on one side of the modified layer 23a has the width W1, the index amount W in the Y direction is set to satisfy $W1 \leq W \leq 2 \times W1$.

In the present embodiment, when forming the altered layer 23, for example, the laser output is 2.0 W, the feed rate is 785 mm/s, and the processing time is about 15 minutes. However, these conditions are only examples. The present inventors have confirmed that the altered layer 23 is appropriately formed by adjusting the conditions when the laser output is higher or lower than 2.0 W.

The processed wafer 20 is formed to have the beveling portion 21. Therefore, when the laser beam L is irradiated from the other side 20b of the processed wafer 20 as described above, there is a possibility that the altered layer 23 is not properly formed inside the beveling portion 21 due to the scattering of the laser beam or the like.

Therefore, in the present embodiment, the beveling portion 21 is formed so that the area of the other side 20b of the processed wafer 20 is larger than the area of the one side 20a. As compared with the case where the beveling portion 21 is formed so that the area of the other side 20b of the processed wafer 20 is equal to or less than the area of the one side 20a, the laser beam L can be easily irradiated to the immediate vicinity of the outer edge portion of the processed wafer 20. Therefore, the altered layer 23 can be easily formed up to the outer edge portion of the processed wafer 20.

Figure 7:
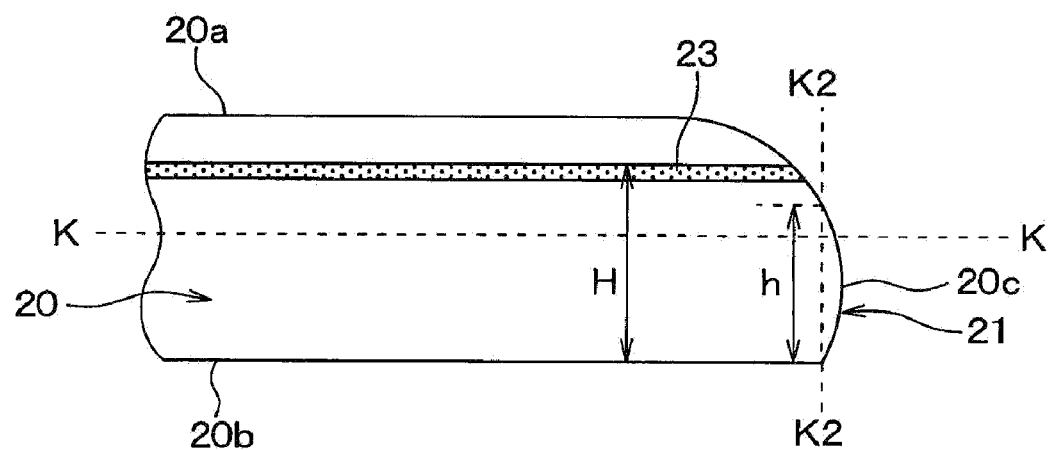
FIG. 7 is a schematic cross-sectional view illustrating a relationship between the altered layer and the shape of the beveling portion when the processed wafer of FIG. 1E is irradiated with a laser beam.

In the present embodiment, as shown in FIG. 7, the beveling portion 21 and the depth H are adjusted so that the altered layer 23 does not intersect the second orthogonal virtual plane K2. In other words, the beveling portion 21 and the depth H are adjusted so that a depth h from the boundary between the other side 20b and the beveling portion 21 to the side surface 20c is shorter than the depth H in the depth direction. The depth h from the boundary between the other side 20b and the beveling portion 21 to the side surface 20c is, in other words, a length of the second orthogonal virtual plane K2 located inside the processed wafer 20. As a result, since the other side 20b is located to face the altered layer 23, the laser beam L can be sufficiently focused on the area where the altered layer 23 is formed.

Figure 1F:
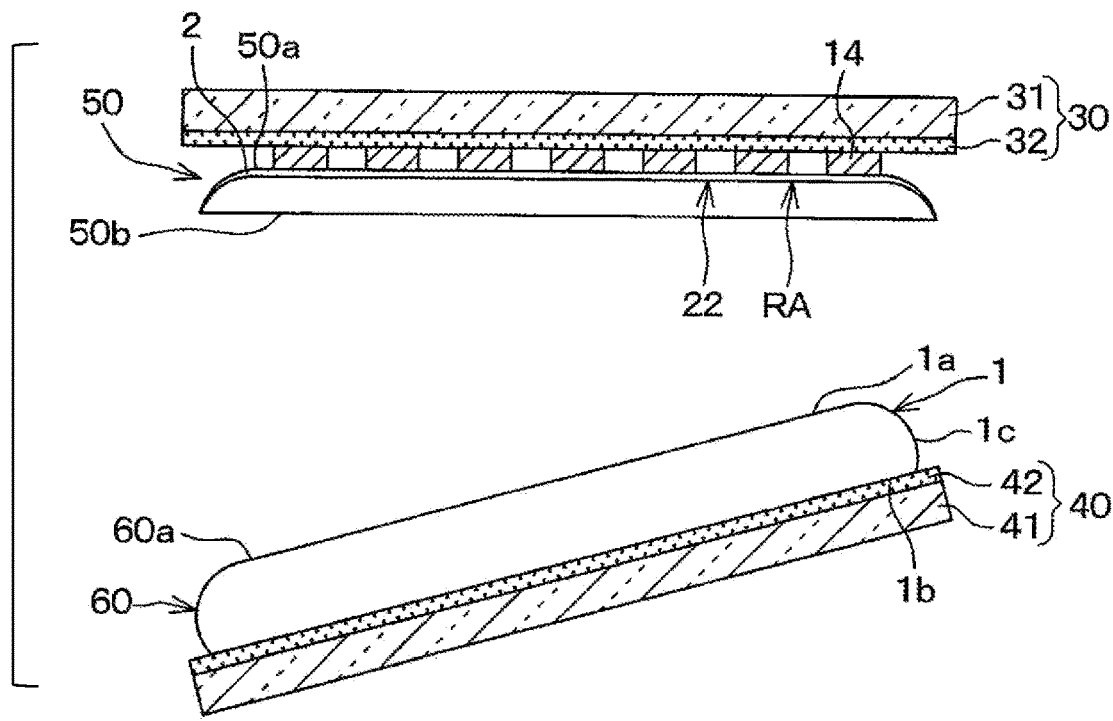
FIG. 1F is a cross-sectional view illustrating a manufacturing process of the semiconductor chip subsequent to FIG. 1E.

Next, as shown in FIG. 1F, an auxiliary member 40 is arranged on the other side 20b of the processed wafer 20. The auxiliary member 40, for example, similar to the holding member 30, includes a base material 41 and an adhesive 42 whose adhesive strength can be changed. In this case, the base material of the auxiliary member 40 is made of, for example, glass, silicon substrate, ceramics, or the like. The adhesive 42 of the auxiliary member 40 is made of, for example, ultraviolet curable resin, wax, double-sided tape, or the like. Then, the holding member 30 and the auxiliary member 40 are gripped and a tensile force or the like is applied in the thickness direction of the processed wafer 20, such that the wafer is divided into the chip formation wafer 50 and the recycle wafer 60 at the altered layer 23 as a boundary (that is, the starting point of branching).

In the following, the chip formation wafer 50 has the one side 50a on which the one-side element component 22 is formed, and the other side 50b from which one side 60a of the recycle wafer 60 is separated. Further, in the drawings after FIG. 1F, the altered layer 23 and the like remaining on the other side 50b of the chip formation wafer 50 and the one side 60a of the recycle wafer 60 are appropriately omitted.

Figure 1G:
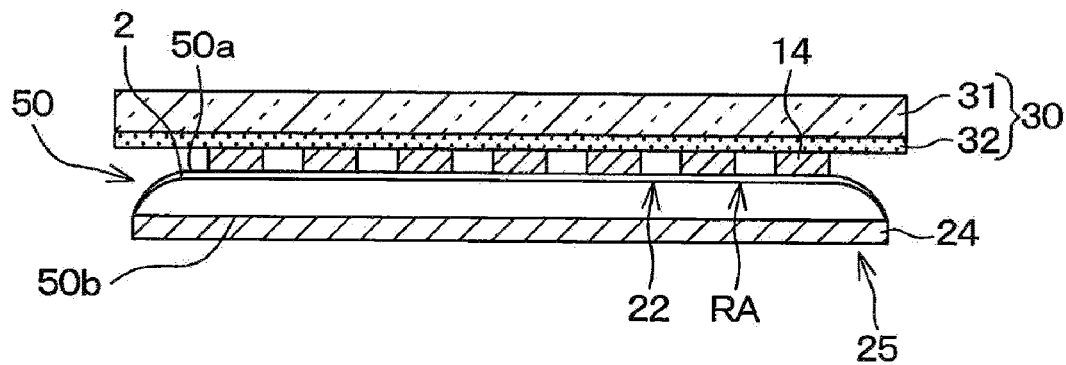
FIG. 1G is a cross-sectional view illustrating a manufacturing process of the semiconductor chip subsequent to FIG. 1F.

After that, as shown in FIG. 1G, a general semiconductor manufacturing process is performed, to form the other-side element component 25 of the semiconductor element such as the metal film 24 constituting the back surface electrode on the other side 50b of the chip formation wafer 50.

Before the step of forming the other-side element component 25, the other side 50b of the chip formation wafer 50 may be flattened by a chemical mechanical polishing (CMP) if necessary. FIG. 1G shows a view when the other side 50b of the chip formation wafer 50 is flattened. Further, after forming the other-side element component 25, heat treatment such as laser annealing or the like may be performed in order to make ohmic contact between the metal film 24 and the other side 50b of the chip formation wafer 50, if necessary.

Figure 1H:
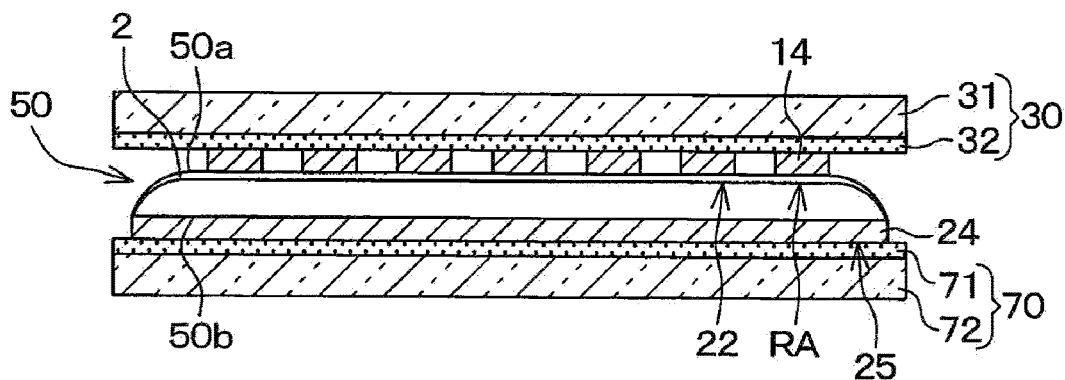
FIG. 1H is a cross-sectional view illustrating a manufacturing process of the semiconductor device subsequent to FIG. 1G.

After that, as shown in FIG. 1H, a support member 70 is arranged on the other side 50b of the chip formation wafer 50 to face the metal film 24. The support member 70 is made of, for example, a dicing tape or the like. Similarly to the holding member 30, the support member 70 may include a base material 71 and an adhesive 72 capable of changing the adhesive force. When the support member 70 is composed of the base material 71 and the adhesive 72, the base material 71 is made of, for example, glass, silicon substrate, or ceramics, and the adhesive 72 is made of, for example, ultraviolet curable resin, wax, or double-sided tape.

Figure 1I:
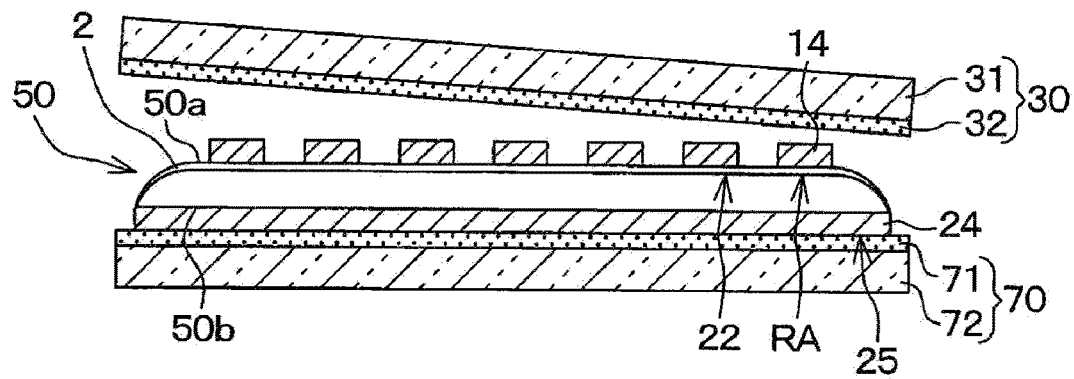
FIG. 1I is a cross-sectional view illustrating a manufacturing process of the semiconductor chip subsequent to FIG. 1H.

Next, as shown in FIG. 1I, the adhesive force of the adhesive 32 of the holding member 30 is weakened, and the holding member 30 attached to the one side 50a of the chip formation wafer 50 is separated off. For example, when the adhesive 32 is made of ultraviolet curable resin, the holding member 30 is peeled off by irradiating with ultraviolet rays.

Figure 1J:
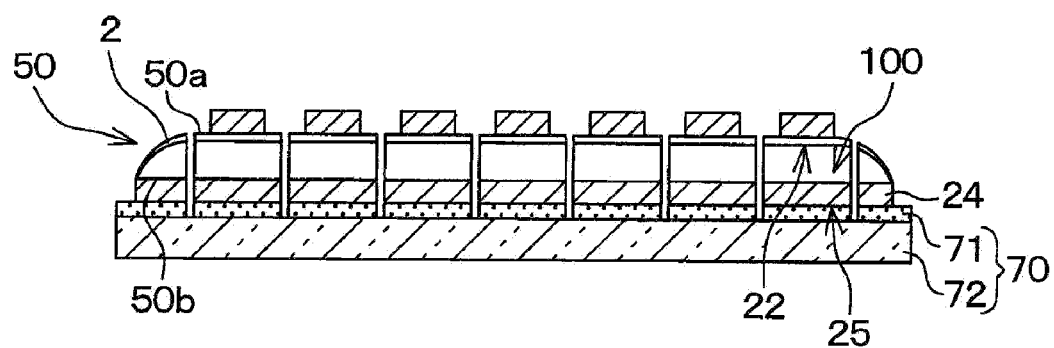
FIG. 1J is a cross-sectional view illustrating a manufacturing process of the semiconductor chip subsequent to FIG. 1I.

Subsequently, as shown in FIG. 1J, each semiconductor chip 100 is produced by separating the chip formation wafer 50 into chip units by a dicing saw, laser dicing, or the like. At this time, in the present embodiment, the dicing depth is adjusted so that the base material 71 of the support member 70 remains connected without being cut while dividing the chip formation wafer 50 into chip units.

Although the subsequent steps are not shown in the drawings, the support member 70 is expanded and the distance between the semiconductor chips 100 is widened at the dicing cut portion. After that, the adhesive force of the adhesive 72 is weakened by heat treatment or irradiation with light, and the semiconductor chip 100 is picked up. As a result, the semiconductor chip 100 is manufactured.

Figure 1K:
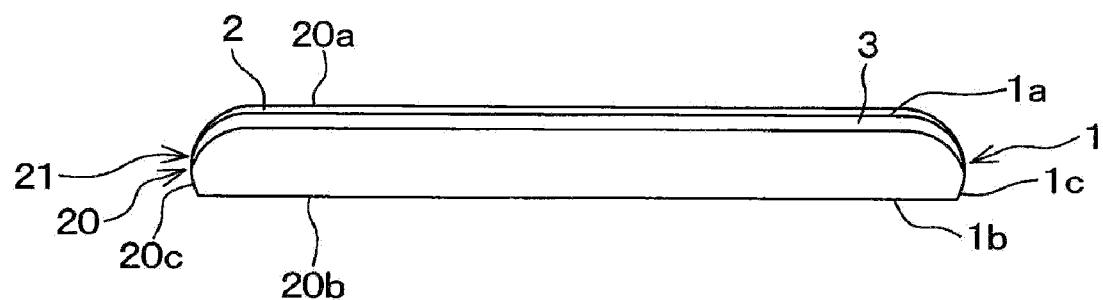
FIG. 1K is a cross-sectional view of a processed wafer having a thickness epitaxial film on a recycle wafer formed in the process of FIG. 1F.

Further, the recycle wafer 60 configured in the process shown in FIG. 1F is used as the SiC wafer 1 again in steps after FIG. 1A. As a result, the SiC wafer 1 can be reused plural times to form the semiconductor chip 100. In this case, it is preferable that the SiC wafer 1 is subjected to a CMP method using a polishing apparatus, dry etching, or the like so that the one side 60a of the recycle wafer 60 becomes a flat surface and the altered layer 23 does not remain. Further, when the thickness of the recycle wafer 60 (that is, the SiC wafer 1) becomes thin, as shown in FIG. 1K, a thickness epitaxial film 3 is provided for ensuring the thickness of the SiC wafer 1. The processed wafer 20 may be formed by forming the epitaxial film 2 on the SiC wafer 1. The thickness epitaxial film 3 is composed of, for example, an $n^+$ type epitaxial layer. When the thickness epitaxial film 3 is formed, the shape adjustment process for forming the beveling portion 21 may be performed after the thickness epitaxial film 3 is formed, or after the epitaxial film 2 is formed. When the shape adjustment process is performed after the thickness epitaxial film 3 is formed, the beveling portion 21 is formed by the epitaxial film 2 taking over the shape of the thickness epitaxial film 3 when the epitaxial film 2 is formed.

According to the present embodiment, the beveling portion 21 is formed so that the area of the other side 20b of the processed wafer 20 is larger than the area of the one side 20a. Therefore, the laser beam L is easily irradiated to the immediate vicinity of the outer edge portion of the processed wafer 20, when the altered layer 23 is formed inside the processed wafer 20 by irradiating the laser beam L, compared with a case where the area of the other side 20b of the processed wafer 20 is equal to or less than the area of the one side 20a. Therefore, the altered layer 23 can be easily formed up to the outer edge portion of the processed wafer 20, and the chip formation wafer 50 can be easily separated from the processed wafer 20.

When irradiating the outer edge portion of the processed wafer 20 with the laser beam L, an edge trimming may be performed to remove the beveling portion 21 before irradiating the laser beam L, such that the side surface 20c of the processed wafer 20 is made orthogonal to the one side 20a. However, in this method, the area of the processed wafer 20 is reduced. In the present embodiment, the processed wafer 20 is separated into the chip formation wafer 50 and the recycle wafer 60 with the altered layer 23 as a boundary, and the separated recycle wafer 60 is used again as the SiC wafer 1. In the method of removing the beveling portion 21, the area of the SiC wafer 1 becomes smaller each time forming the chip formation wafer 50. In this case, the number of semiconductor chips 100 to be manufactured gradually decreases.

In contrast, according to the present embodiment, since it is only necessary to adjust the shape of the beveling portion 21, it is possible to restrict the area of the SiC wafer 1 from decreasing. Therefore, in the present embodiment, while suppressing the SiC wafer 1 from becoming smaller each time manufacturing the semiconductor chip 100, the processed wafer 20 can preferably be separated into to the chip formation wafer 50 and the recycle wafer 60 (that is, the SiC wafer 1).

(1) In the present embodiment, the beveling portion 21 is formed so that the curvature of the first portion between the other side 20b and the horizontal virtual plane K is larger than the curvature of the second portion between the one side 20a and the horizontal virtual plane K. Thereby, the processed wafer 20 in which the area of the other side 20b is larger than the area of the one side 20a can be easily produced.

(2) In the present embodiment, the beveling portion 21 and the depth H are adjusted such that the depth h from the boundary between the other side 20b and the beveling portion 21 to the side surface 20c is shorter than the depth H in the depth direction. Therefore, since the other side 20b is located within the area facing the altered layer 23, the laser beam L can be sufficiently focused on the area where the altered layer 23 is formed. Therefore, it is possible to form the altered layer 23 up to the side surface 20c of the processed wafer 20.

Although the present disclosure has been described in accordance with the embodiment, it is understood that the present disclosure is not limited to such embodiments or structures. The present disclosure encompasses various modifications and variations within the scope of equivalents. In addition, various combinations and configurations, as well as other combinations and configurations that include only one element, more, or less, are within the scope and spirit of the present disclosure.

Further, in the embodiment, in the step of forming the epitaxial film 2 of FIG. 1B, the epitaxial film may also be formed on the second main surface 1b of the SiC wafer 1. In this case, it becomes easy to leave a thickness equal to or more than a predetermined thickness as the recycle wafer 60, and the number of times reusing the recycle wafer can be increased.

What is claimed is:

1. A method of manufacturing a chip formation wafer on which a semiconductor element is formed, the method comprising:
preparing a silicon carbide wafer made of silicon carbide and having a first main surface and a second main surface opposite to the first main surface;
forming an epitaxial film made of silicon carbide on the first main surface of the silicon carbide wafer to provide a processed wafer having one side adjacent to the epitaxial film and the other side made of the silicon carbide wafer;
irradiating a laser beam into the processed wafer from the other side of the processed wafer so as to form an altered layer along a surface direction of the processed wafer;
separating the processed wafer into a chip formation wafer having the one side of the processed wafer and a recycle wafer having the other side of the processed wafer with the altered layer as a boundary; and
reusing the recycle wafer as a silicon carbide wafer, wherein
the processed wafer has a beveling portion at an outer edge portion of the processed wafer,
an area of the other side is larger than an area of the one side in the beveling portion,
a depth from a boundary between the other side and the beveling portion to a side surface connecting the one side and the other side is shorter than a depth from the other side to the altered layer in a depth direction from the other side to the one side, in the preparing of the processed wafer, and
reusing the recycle wafer comprises
performing a chemical mechanical polishing process on the recycle wafer,
forming an epitaxial film on a surface of the recycle wafer, and
performing a shape adjustment process to form a beveling portion on the recycle wafer, wherein
an area of the recycle wafer after the shape adjustment process is performed is not less than an area of the processed wafer.

2. The method according to claim 1, wherein
a virtual plane is defined along the surface direction of the processed wafer to pass through a center between the one side and the other side,
the beveling portion has a first portion located between the virtual plane and the other side, and a second portion located between the virtual plane and the one side, and
the beveling portion is formed so that a curvature of the first portion is larger than a curvature of the second portion, in the preparing of the processed wafer.

3. The method according to claim 1, wherein
the depth from the other side to the altered layer in the depth direction from the other side to the one side is between 200 µm and 370 µm.

4. A processed wafer made of silicon carbide comprising:
a one side;
an other side opposite to the one side;
a beveling portion formed on a side surface connecting the one side and the other side at an outer edge portion of the silicon carbide; and
an altered layer at a position having a first depth from the other side, wherein
an area of the other side is larger than an area of the one side in the beveling portion,
a second depth from a boundary between the other side and the beveling portion to the side surface connecting the one side and the other side is shorter than the first depth from the other side to the altered layer in a depth direction from the other side to the one side, and
the altered layer extends to the beveling portion at the side surface of the processed wafer.

5. The processed wafer according to claim 4, wherein
the first depth from the other side to the altered layer in the depth direction from the other side to the one side is between 200 µm and 370 µm.

* * * * *